(12) United States Patent
Robinson et al.

(10) Patent No.: US 9,462,732 B2
(45) Date of Patent: Oct. 4, 2016

(54) ELECTROMAGNETIC INTERFERENCE SHIELDING (EMI) APPARATUS INCLUDING A FRAME WITH DRAWN LATCHING FEATURES

(71) Applicant: Laird Technologies, Inc., Earth City, MO (US)

(72) Inventors: Kenneth M. Robinson, Effort, PA (US); Marc Fucci, Easton, PA (US); Paul W. Crotty, Jr., East Stroudsburg, PA (US)

(73) Assignee: LAIRD TECHNOLOGIES, INC., Earth City, MO (US)

( * ) Notice: Subject to any disclaimer, the term of this patent is extended or adjusted under 35 U.S.C. 154(b) by 165 days.

(21) Appl. No.: 13/800,384

(22) Filed: Mar. 13, 2013

(65) Prior Publication Data
US 2014/0262473 A1 Sep. 18, 2014

(51) Int. Cl.
*H05K 9/00* (2006.01)
(52) U.S. Cl.
CPC ........ *H05K 9/0032* (2013.01); *Y10T 29/49002* (2015.01)
(58) Field of Classification Search
CPC ...................................................... H05K 9/00
USPC ................. 174/372; 361/728–747, 752–759, 361/796–802, 805–837
See application file for complete search history.

(56) References Cited

U.S. PATENT DOCUMENTS

| | | |
|---|---|---|
| 3,234,318 A | 2/1966 | Lieshout et al. |
| 4,066,837 A | 1/1978 | Miura |
| 4,759,466 A | 7/1988 | Chase et al. |
| 4,780,570 A | 10/1988 | Chuck |
| 5,354,951 A | 10/1994 | Lange, Sr. et al. |
| 5,383,098 A | 1/1995 | Ma et al. |
| 5,495,399 A | 2/1996 | Gore et al. |
| 6,181,573 B1 * | 1/2001 | Riet .............................. 361/816 |

(Continued)

FOREIGN PATENT DOCUMENTS

| | | |
|---|---|---|
| CN | 1499923 | 5/2004 |
| CN | 1543301 | 11/2004 |

(Continued)

OTHER PUBLICATIONS

International Search Report and Written Opinion issued for PCT International Application No. PCT/US2013/076643 dated Mar. 20, 2014, which claims priority to the instant application;11 pages.

*Primary Examiner* — Rashen E Morrison
(74) *Attorney, Agent, or Firm* — Harness, Dickey & Pierce, P.L.C.

(57) ABSTRACT

Exemplary embodiments are disclosed of shielding apparatus or assemblies having a frame with drawn latching features or portions that are configured for removably attaching a cover to the frame. In an exemplary embodiment, there is a shielding apparatus suitable for use in providing electromagnetic interference shielding for one or more electrical components on a substrate. In this example, the shielding apparatus generally includes a cover and a frame. The cover includes one or more openings. The frame includes a top surface and sidewalls configured to be disposed generally about one or more electrical components on a substrate. The frame is partly drawn in construction such that the frame includes one or more drawn latching features or portions configured to be engaged within the one or more openings of the cover to thereby releasably attach the cover to the frame.

20 Claims, 6 Drawing Sheets

(56) References Cited

U.S. PATENT DOCUMENTS

| | | |
|---|---|---|
| 6,274,808 B1 | 8/2001 | Cercioglu et al. |
| 6,377,472 B1 | 4/2002 | Fan |
| 6,384,324 B2 | 5/2002 | Flegeo |
| 6,388,189 B1 | 5/2002 | Onoue |
| 6,426,459 B1 | 7/2002 | Mitchell |
| 6,624,353 B2 | 9/2003 | Gabower |
| 6,649,827 B2 | 11/2003 | West et al. |
| 6,711,032 B2 | 3/2004 | Sommer |
| 6,754,088 B2 | 6/2004 | Takeda |
| 6,754,988 B1 | 6/2004 | Downey |
| 6,908,338 B2 | 6/2005 | Okamoto |
| 6,992,901 B1 | 1/2006 | Hung |
| 7,262,369 B1 * | 8/2007 | English ............ 174/370 |
| 7,345,248 B2 | 3/2008 | Vinokor et al. |
| 7,488,902 B2 | 2/2009 | English et al. |
| 7,504,592 B1 | 3/2009 | Crotty, Jr. |
| 7,889,515 B2 | 2/2011 | Boetto et al. |
| 7,903,431 B2 * | 3/2011 | English et al. ............ 361/816 |
| 2002/0185294 A1 | 12/2002 | Shlyakhtichman et al. |
| 2004/0240192 A1 | 12/2004 | Seidler |
| 2005/0018411 A1 | 1/2005 | Lum et al. |
| 2005/0219832 A1 | 10/2005 | Pawlenko et al. |
| 2007/0012479 A1 * | 1/2007 | Vinokor ............ H05K 9/0039 174/382 |
| 2007/0139904 A1 | 6/2007 | English et al. |
| 2009/0016039 A1 | 1/2009 | Imamura |
| 2009/0067149 A1 * | 3/2009 | Bogursky et al. ............ 361/816 |
| 2009/0242264 A1 * | 10/2009 | Lei ............ 174/382 |
| 2009/0244876 A1 | 10/2009 | Li et al. |
| 2011/0073360 A1 | 3/2011 | Su |
| 2011/0176279 A1 | 7/2011 | Zhao et al. |
| 2011/0266045 A1 * | 11/2011 | Xiong et al. ............ 174/350 |
| 2012/0281386 A1 * | 11/2012 | Kim ............ 361/818 |
| 2013/0033843 A1 | 2/2013 | Crotty, Jr. |
| 2014/0262473 A1 * | 9/2014 | Robinson ............ H05K 9/0032 174/372 |

FOREIGN PATENT DOCUMENTS

| | | |
|---|---|---|
| CN | 1914967 | 2/2007 |
| CN | 10340806 | 10/2012 |
| DE | 3740495 | 11/1987 |
| DE | 19732618 | 7/1997 |
| EP | 0420504 | 4/1991 |
| EP | 1641074 | 2/2007 |
| GB | 2152291 | 7/1985 |
| JP | 11307975 | 11/1999 |
| KR | 10-0293940 | 7/2001 |
| WO | WO95/27390 | 10/1995 |
| WO | WO00/25563 | 5/2000 |
| WO | WO2006/076258 | 7/2006 |
| WO | WO 2008/156882 | 2/2008 |
| WO | WO 2009/006838 | 1/2009 |

* cited by examiner

ELECTROMAGNETIC INTERFERENCE SHIELDING (EMI) APPARATUS INCLUDING A FRAME WITH DRAWN LATCHING FEATURES

FIELD

The present disclosure generally relates to electromagnetic shielding apparatus for electronic systems and devices, and more particularly (but not exclusively) to multi-piece shielding apparatus or assemblies having a frame with drawn latching features configured for removably attaching a cover to the frame.

BACKGROUND

This section provides background information related to the present disclosure which is not necessarily prior art.

The operation of electronic devices generates electromagnetic radiation within the electronic circuitry of the equipment. Such radiation may result in electromagnetic interference (EMI) or radio frequency interference (RFI), which can interfere with the operation of other electronic devices within a certain proximity. Without adequate shielding, EMI/RFI interference may cause degradation or complete loss of important signals, thereby rendering the electronic equipment inefficient or inoperable.

A common solution to ameliorate the effects of EMI/RFI is through the use of shields capable of absorbing and/or reflecting and/or redirecting EMI energy. These shields are typically employed to localize EMI/RFI within its source, and to insulate other devices proximal to the EMI/RFI source.

For example, electrically conducting (and sometimes magnetically conducting) material may be interposed between two portions of electronic circuitry for absorbing and/or reflecting EMI energy. This shielding may take the form of a wall or a complete enclosure and may be placed around the portion of the electronic circuit generating the electromagnetic signal and/or may be placed around the portion of the electronic circuit that is susceptible to the electromagnetic signal.

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) broadly includes and refers to mitigating (or limiting) EMI and/or RFI, such as by absorbing, reflecting, blocking, and/or redirecting the energy or some combination thereof so that it no longer interferes, for example, for government compliance and/or for internal functionality of the electronic component system.

SUMMARY

This section provides a general summary of the disclosure, and is not a comprehensive disclosure of its full scope or all of its features.

According to various aspects, exemplary embodiments are disclosed of shielding apparatus or assemblies having a frame with drawn latching features or portions that are configured for removably attaching a cover to the frame. In an exemplary embodiment, there is a shielding apparatus suitable for use in providing electromagnetic interference shielding for one or more electrical components on a substrate. In this example, the shielding apparatus generally includes a cover and a frame. The cover includes one or more openings. The frame includes a top surface and sidewalls configured to be disposed generally about one or more electrical components on a substrate. The frame is partly drawn in construction such that the frame includes one or more drawn latching features or portions configured to be engaged within the one or more openings of the cover to thereby releasably attach the cover to the frame.

Also disclosed are methods of making electromagnetic interference shielding apparatus or assemblies. In an exemplary embodiment, there is a method for making a frame of an electromagnetic interference shielding apparatus where the frame includes a top surface and sidewalls downwardly depending from the top surface. In this example, the method generally includes drawing a piece of material such that the top surface includes spaced-apart drawn portions protruding outwardly from the sidewalls. The spaced-apart drawn portions are configured for engagement within openings of a cover for removably attaching the cover to the frame. The spaced-apart drawn portions may be formed by drawing the piece of material without cutting the drawn portions. Openings may be formed along the sidewalls of the frame where material was drawn to form the spaced-apart drawn portions.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Figure 4:
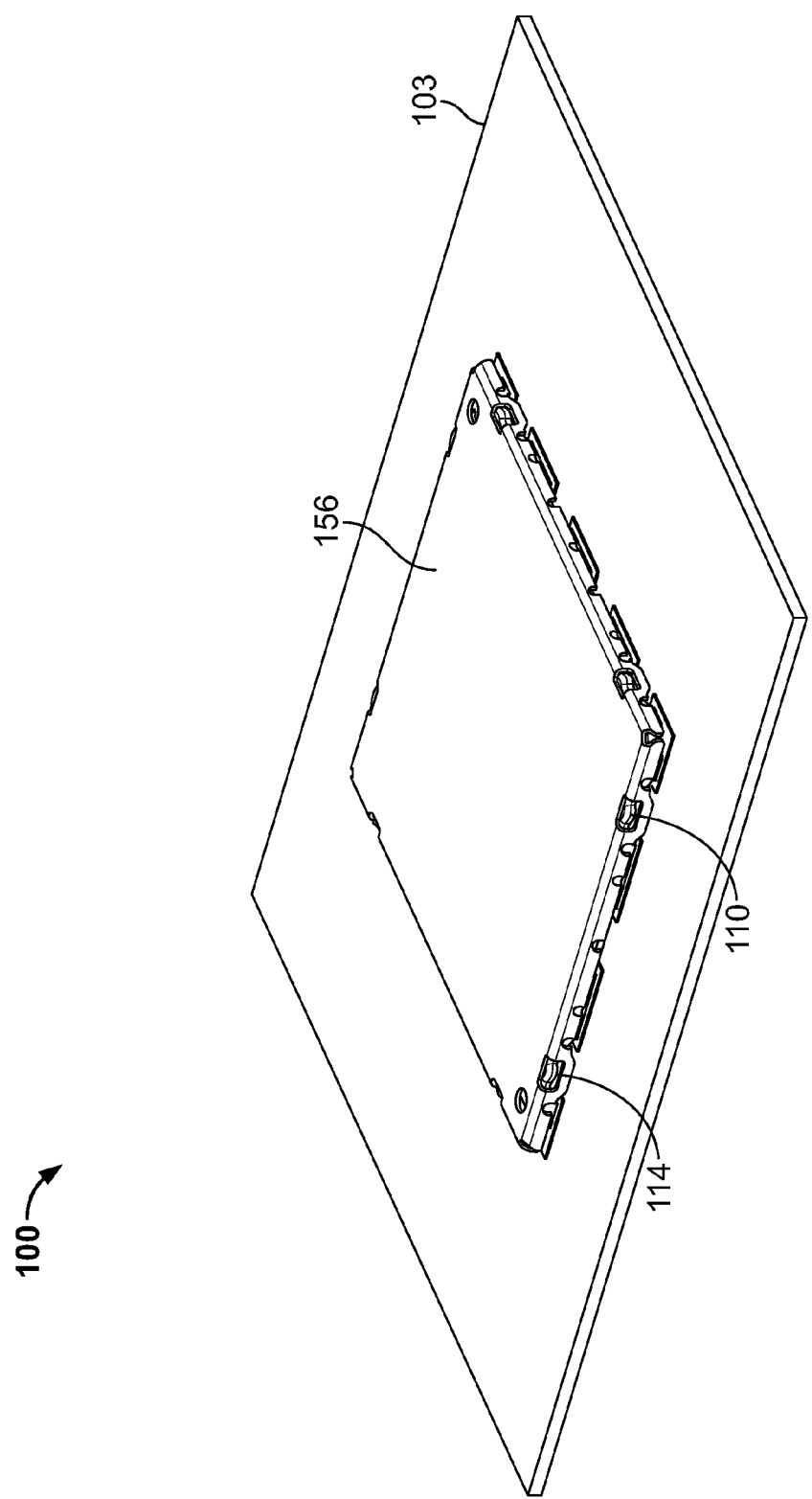
FIG. 4 is a perspective view of the shielding apparatus shown in FIG. 3 with the cover removably attached to the frame via the drawn latching features of the frame, whereby the shielding apparatus is operable for shielding the one or more electrical components on the PCB that are within an interior cooperatively defined by the frame, the cover, and the PCB.
Figure 7:
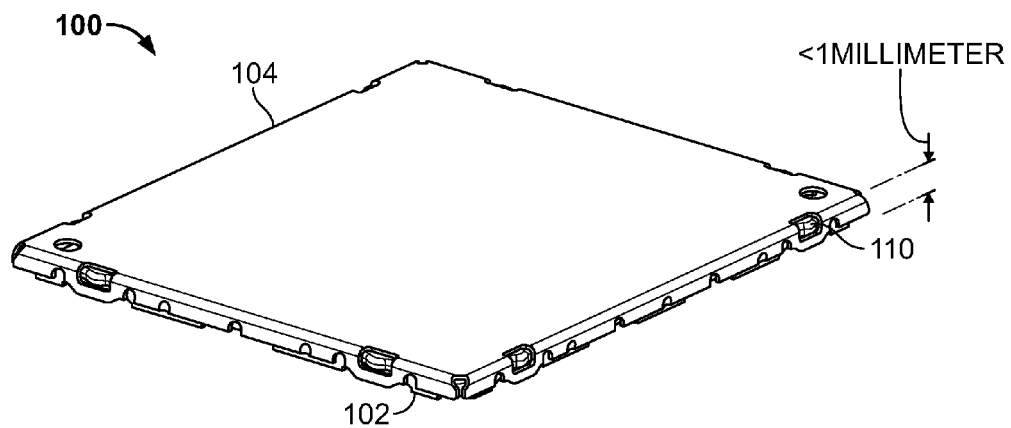
Figure 8:
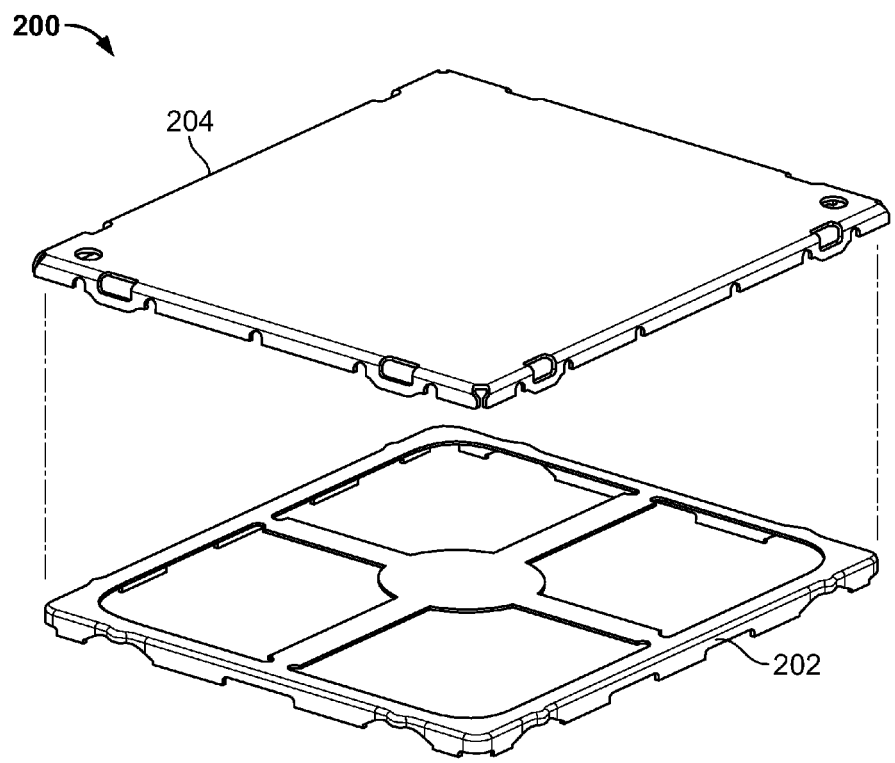

FIG. 7 is a perspective view of the shielding apparatus shown in FIG. 4 where the height dimension in millimeters is provided for purpose of illustration only according to an exemplary embodiment; and FIG. 8 is an exploded perspective view of another exemplary embodiment of a shielding apparatus having a cover and a frame (or fence) with drawn latching features, where the cover does not include inwardly extending half dimples.

Corresponding reference numerals indicate corresponding parts throughout the several views of the drawings.

DETAILED DESCRIPTION

Example embodiments will now be described more fully with reference to the accompanying drawings.

Conventional EMI shielding soldered metal cans may have removable lids for inspection or repair. But the inventors hereof have recognized that there is a lower limit to the total height from the board level to the top of such conventional shields. This limit is due to the size of the needed attachment feature when the lid attached on the frame starts to approach a limit of what is possible for the given material thickness.

After recognizing the above, the inventors developed and disclose herein exemplary embodiments of multi-piece shielding apparatus or assemblies having a cover (or lid) and a frame (or fence) with drawn latching features. As disclosed herein, the frame is at least partially drawn with latching features (latching members, protruding portions, or latches) in or extending outwardly from a top surface of the frame. The frame's drawn latching features are configured to be engaged within openings of the cover such that the cover may be removably attached to (e.g., releasably latched or snapped onto, etc.) the frame.

Figure 1:
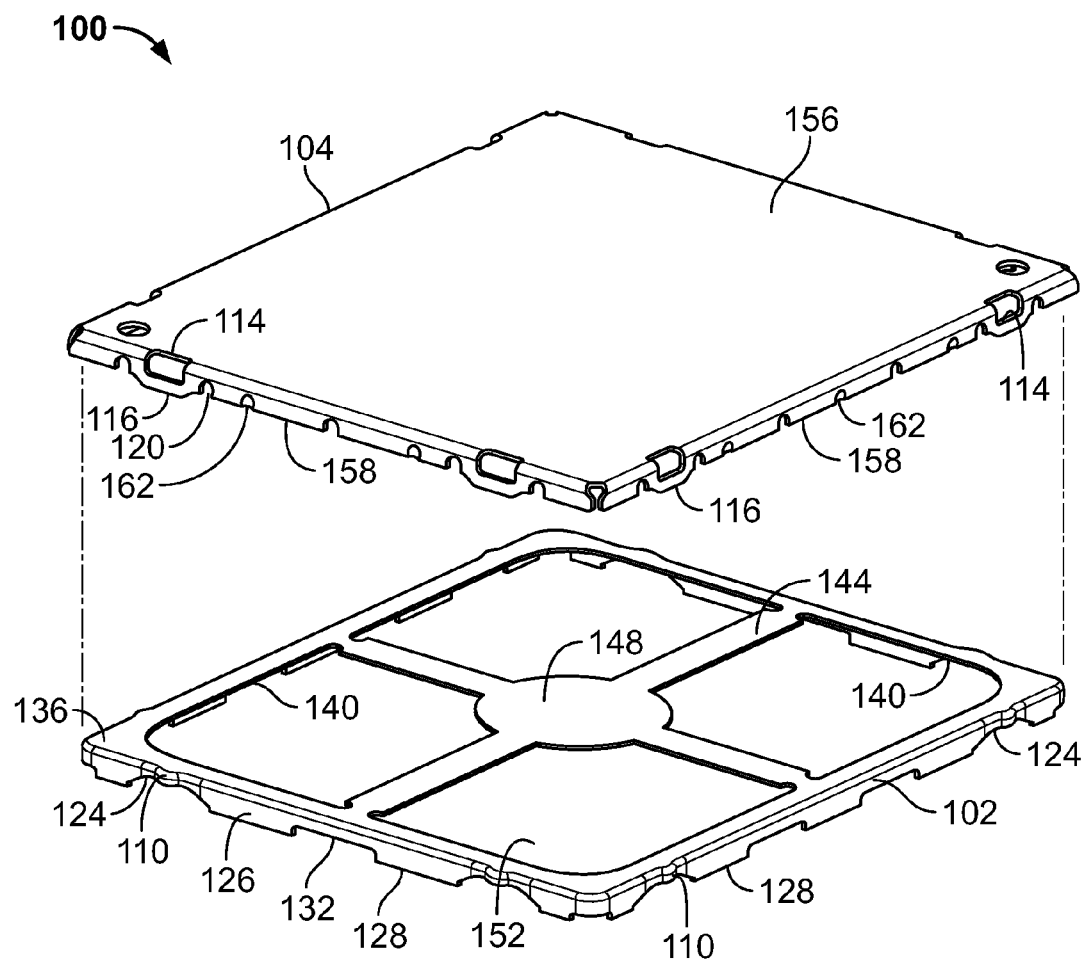
FIG. 1 is an exploded perspective view of an exemplary shielding apparatus having a cover and a frame, where the frame is at least partially drawn and includes drawn latching features for removably attaching the cover to the frame according to an exemplary embodiment.
Figure 2:
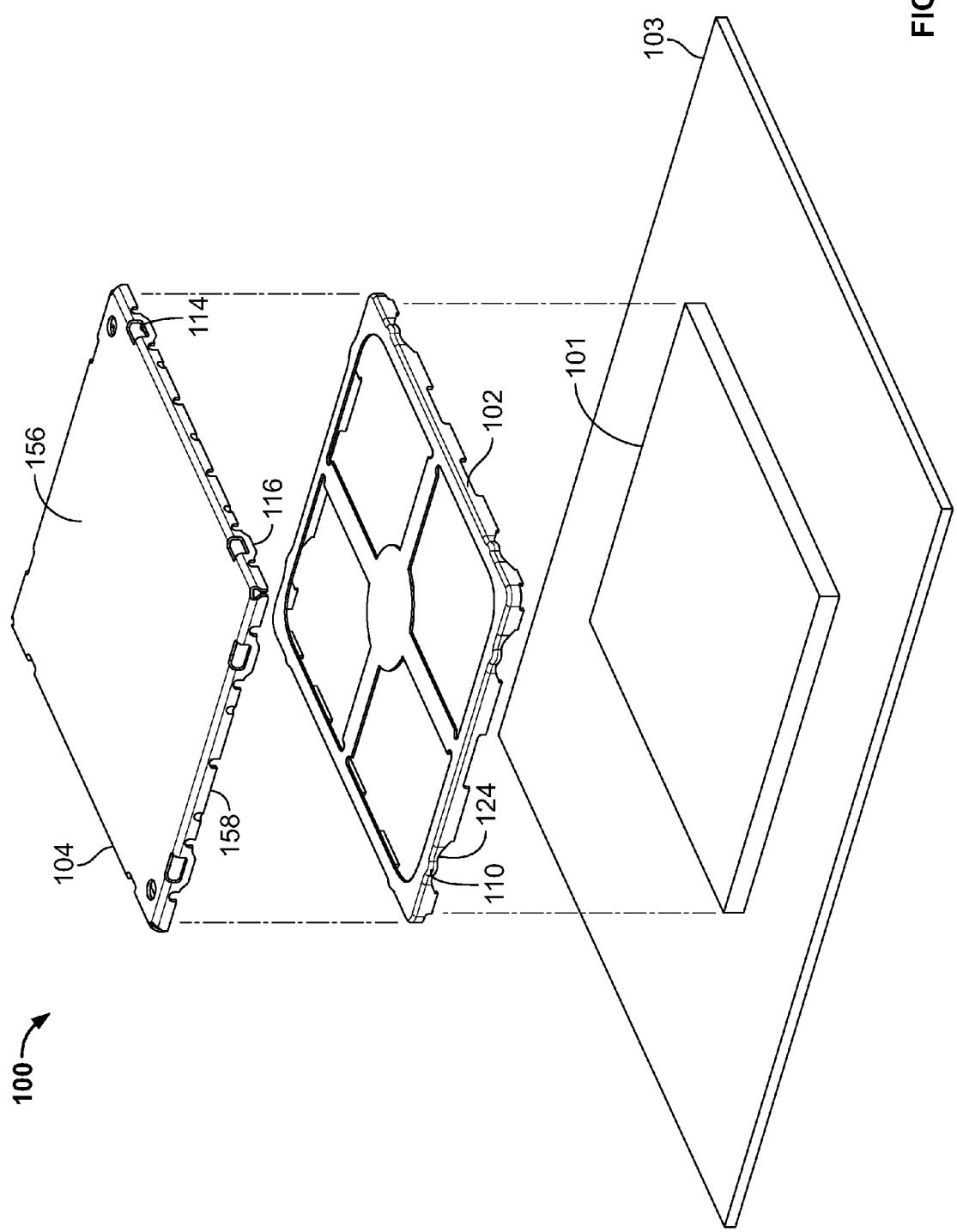
FIG. 2 is another exploded perspective view of the shielding apparatus shown in FIG. 1 and also illustrating a printed circuit board (PCB) having one or more electrical components thereon.
Figure 3:
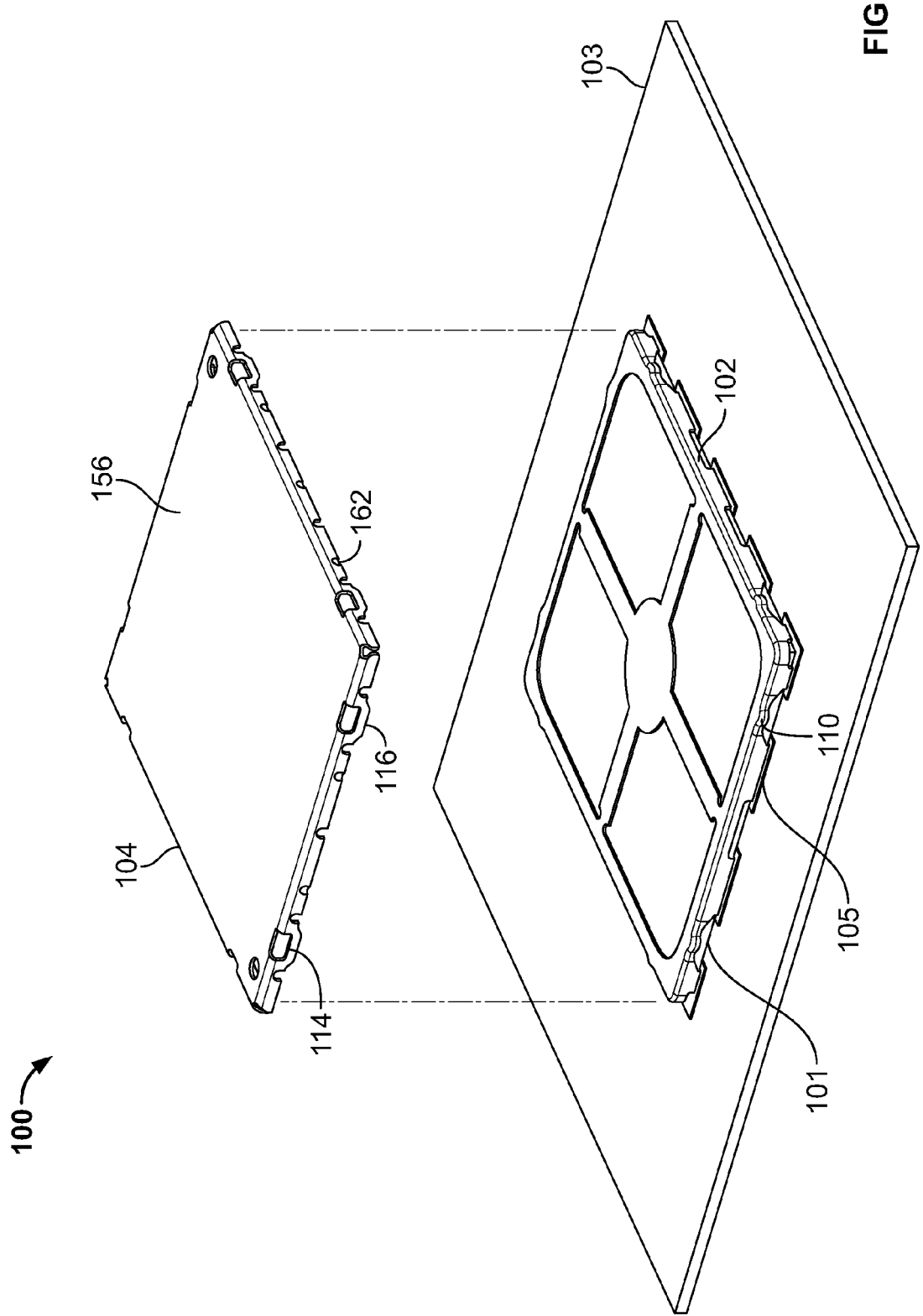
FIG. 3 is a perspective view of the shielding apparatus shown in FIG. 2 with the frame mounted on the PCB.

With reference now to the figures, FIGS. 1 through 4 illustrate an exemplary embodiment of a shielding apparatus 100 embodying one or more aspects of the present disclosure. The shielding apparatus 100 includes a frame (or fence) 102 and a cover (or lid) 104. The shielding apparatus 100 is suitable for use in providing electromagnetic interference (EMI) shielding to one or more electrical components 101 on a printed circuit board 103 (a PCB, and more broadly, a substrate) as shown in FIGS. 2-4.

The frame 102 may be installed (e.g., soldered, etc.) to the PCB 103. The cover 104 is removably attachable (e.g., releasably latched or snapped onto, etc.) to the frame 102 such that the shielding apparatus 100 is operable for shielding the one or more electrical components 101 on the PCB 103 that are within an interior cooperatively defined by the frame 102, the cover 104, and the PCB 103. The cover 104 may later be detached (e.g., unlatched, etc.) and removed from the frame 102 to allow access to the electrical components 101, e.g., for servicing, testing, repairing, replacing the electrical components, etc.

The frame 102 is at least partially drawn with latching features 110 (or protruding portions, members, or latches) in or protruding outwardly from the frame 102. The frame's drawn latching features 110 are configured to be positioned within openings 114 of the cover 104, to thereby removably attach the cover 104 to the frame 102. For example, the cover 104 may be positioned over the frame 102 and then moved downward onto the frame 102. With this downward movement, the drawn latching features 110 of the frame 102 contact and slide along the free ends (or cam surfaces) of the cover's retention members or portions 116 (or fingers or tabs) that include the openings 114.

The sliding contact of the drawn latching features 110 with the cover's retention members 116 causes the retention members 116 to flex, deform, move, pivot, or cam outwardly from their original or initial position. This outward movement of the cover's retention members 116 allows the frame's drawn latching features 110 to move beyond or above the free ends of the cover's retention members 116 and into the openings 114. The cover's retention members 116 may be generally resilient in nature so that their free ends may be flexed generally outwardly. Then, after the frame's drawn latching features 110 have moved past the free ends of the cover's retention members 116 and into the openings 114, the resilient nature of the cover's retention members 116 causes the retention members 116 to move (e.g., snap back, etc.) generally under the drawn latching features 110. At which point, the frame's drawn latching features 110 are engaged and retained within the openings 114 to thereby attach the cover 104 to the frame 102.

In the illustrated embodiment, the frame 102 includes eight drawn latching features 110. Each corner of the frame 102 is disposed between a corresponding pair of the drawn latching features 110. Correspondingly, the cover 104 also includes eight retention members 116 each having a single opening 114 to receive the corresponding latching feature or protruding portion 110 of the frame 102. Alternative embodiments may include more or less than eight latching features and/or latching features arranged differently, e.g., at different locations, along the frame. For example, an alternative embodiment may include three latching features along each side of the frame.

The cover 104 may be configured to provide room to access each retention member 116 from above the cover 104 to facilitate release/disengagement (e.g., by selective camming, etc.) of the retention member 116 from the respective latching or locking feature 110. For example, a shim (or other suitable tool) may be manually positioned through an opening 114 or cutout 120 of the cover 104 or alongside and underneath a retention member 116 of the cover 104 to force the retention member 116 generally outwardly away (e.g., bend, flex, deform, etc.) from the latching feature 110. This process may need to be repeated until all retention members 116 are released or detached from the frame's latching features 110. It is understood that the retention members 116 may be configured so as to be preferably resistant to yielding such that the retention members 116 are capable of being repeatedly moved outward and inward to accommodate multiple and repeated cycles of attachment, detachment, and reattachment of the cover 104 to the frame 102, while also maintaining the capability of squeezing and/or gripping the frame 102. Thus, the resilient nature of the cover's retention members 116 preferably causes the members to return to their original configuration after the cover 104 is detached from the frame 102 so that the cover 104 may preferably be subsequently reattached to the frame 102.

It should be appreciated that the cover 104 may be attached to, detached from, and subsequently reattached to the frame 102 in a generally vertical direction without impinging on an area outside a general footprint of the shielding apparatus 100. This may advantageously allow for attaching, detaching, and reattaching the cover 104 to/from the frame 102 in confined areas. Accordingly, less space may be required for installation and removal of the cover 104 to/from the frame 102. For example, the cover 104 may be attached to, detached from, and reattached to the frame 102 without interfering with other electrical components mounted on the PCB 103 outside the frame 102. Particularly, the retention members 116 can be engaged to and/or released from the latching features 110 of the frame 102 generally from vertically above the cover 104.

Figure 6:
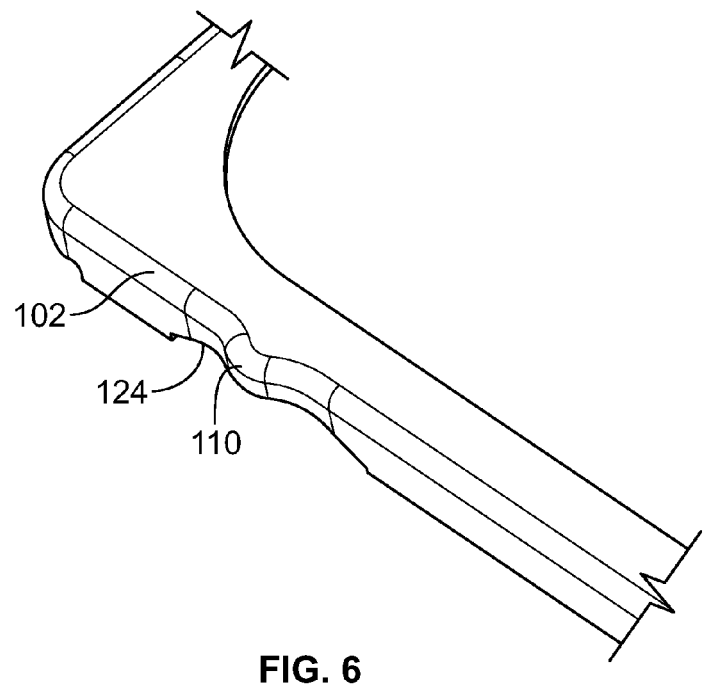
FIG. 6 is an enlarged perspective view of one of the drawn latching features of the frame shown in FIG. 1.

With further regard to the frame's drawn latching features 110, the latching features 110 may be added to a top surface of the frame 102 and controlled with the "sheet metal flat blank" from which the frame 102 is formed. Also, the latching features 110 may be drawn in the frame 102 such that the top surface of the frame 102 is coincident, aligned and/or co-planar with the top surfaces of the latching features 110. As shown in FIG. 6, the latching features 110 do not extend above the top surface of the frame 102 such that the latching features 110 do not require any increased height or space to accommodate for the latching features 110.

In addition, the frame 102 also includes one or more openings 124 (or gaps) in the sidewalls 126 of the frame 102. Each opening 124 is generally under a corresponding one of the latching features 110. The openings 124 are located where the frame material was drawn and thus removed from the frame's sidewalls 126 to form the latching features 110. Accordingly, the absence of the drawn frame material provides or defines the one or more openings 124 along the frame's sidewalls 126 under the one or more latching features 110. Only certain or predetermined portions of the frame material is drawn to form the spaced-apart latching features 110 along the frame 102 at locations corresponding to the openings 114 in the cover 104. At those locations where the material of the frame 102 is drawn to form the latching features 110, the frame 102 includes the openings 124 because the material that was drawn is no longer present. In this exemplary embodiment, the drawn latching features 110 are formed solely by drawing the material from which the frame 102 is made, e.g., without having to cut or otherwise remove material from the frame 102.

The frame 102 is drawn with the latching features 110 located to allow the cover 104 to snap onto the frame 102 in the areas without solder. As shown in FIG. 3, each sidewall 126 of the frame 102 includes lower edge portions 128 (e.g., feet, castellations, etc.) that provide areas for soldering the frame 102 to the PCB 103. Each lower edge portion 128 is preferably substantially co-planar with the other lower edge portions 128 of the other sidewalls 126. This co-planarity helps to provide a good mating surface with the PCB 103 and good electrical contact between the frame's lower edge portions 128 and corresponding portions 105 (e.g., solder pads, traces, grounds, etc.) of the PCB 103.

An opening (e.g., opening 124 or 132) is between each adjacent pair of lower edge portions 128. The openings 124 or 132 may allow solder to flow around the lower edge portions 128 for securing the frame 102 to the PCB 103. In other embodiments, the lower edge portions 128 of the frame 102 may fit in corresponding openings in the PCB 103 for securing the frame 102 to the PCB 103. Depending on the particular application, the frame's lower edge portions 128 may also be configured to allow an airflow to improve temperature uniformity during the reflow process as well as for convection cooling during device operation. The frame's lower edge portions 128 may allow for fluid flow if washing processes are used on the completed PCB. In those installations in which segmented solder traces on the PCB are used that correspond with or match the frame's lower edge portions 128, the molten solder may also be confined to a local area to thereby improve reflow process window. In still further embodiments, the frame 102 may not include any additional openings between adjacent lower edge portions 128 of the frame 102. In other exemplary embodiments, alternative means besides soldering may be employed for securing a frame having drawn latching features of a PCB.

In addition to the drawing process described above, the frame 102 may also be formed by a combination of additional fabricating processes such as stamping, bending, folding, etc. Parts of the frame 102 may be drawn over a die to form the drawn latching features 110. Parts of the frame 102 may also be formed by stamping, folding, or bending to produce the final desired shape. The cover 104 may be formed at least partly by bending, stamping, folding, etc. to produce its final desired shape. Together, the frame 102 and the cover 104 can enclose the desired electrical components 101 on the PCB 103 and provide EMI shielding thereto.

With continued reference to FIGS. 1-3, the illustrated frame 102 is generally rectangular in shape and includes four sidewalls 126 and the upper surface 136 (or top surface) formed integrally (or monolithically) with the sidewalls 126. The sidewalls 126 are also integrally formed with each adjacent sidewall 126 of the frame 102. In other exemplary embodiments, at least part of the frame 102 may be formed separately from another part of the frame 102 and be separately attached thereto. In still other exemplary embodiments, the shielding apparatus 100 may include frames with more or less than four sidewalls and/or sidewalls in a configuration different from that shown in the figures herein. For example, the sidewalls of the frame may have square configurations, triangular configurations, hexagonal configurations, other polygonal-shaped configurations, circular configurations, non-rectangular configurations, etc.

As previously stated, the frame's upper surface 136 is integrally formed with the sidewalls 126. In the illustrated embodiment, the upper surface 136 includes integral flanges or surface portions 140 that extend as one piece along each of the sidewalls 126 around the perimeter of the frame 102. Each flange 140 is oriented generally perpendicularly relative to each sidewall 126, with each sidewall 126 depending generally downwardly from each corresponding flange 140. In other exemplary embodiments, the frame's upper surface 136 may include flanges 140 with openings therein, and/or may include inwardly folded lips, perimeter rims, etc. In still other exemplary embodiments, the upper surface 136 may include upper edges of the sidewalls 126.

The frame's upper surface 136 also includes four cross braces 144 interconnecting the flanges 140. The cross braces 144 extend from a middle location of each of the flanges 140 to a central hub 148. The braces 144 are preferably configured to provide stiffening support to the frame 102, for example, to resist deformation (e.g., bending, etc.). The cross braces 144 may also be configured to help maintain the sidewalls 126 in the generally rectangular shape of the frame 102. In other exemplary embodiments, the cross braces 144 may extend from other locations of the flanges 140 (e.g., from corners of the flanges, etc.), and/or the cross braces 144 may extend directly to other locations of the flanges 140 without using a central hub 148. In still other exemplary embodiments, the frame's upper surface 136 may include no cross braces. Or, the upper surface 136 may include more than or fewer than four cross braces 144 and/or in different orientations.

In the illustrated embodiment, the flanges 140 and cross braces 144 define four openings 152 in the upper surface 136. These openings 152 may be used, for example, to access the electrical components 101 of the PCB 103 contained within the frame 102 after the frame 102 is attached to the PCB 103. In this embodiment (and embodiments in which the frame does not include any cross-braces), the frame 102 may be viewed as an open-top EMI shielding can. In other exemplary embodiments, there may be more or less openings 152 in different sizes and/or shapes than what is illustrated in the figures.

In addition, the illustrated frame 102 is free of interior dividers or partitions so that the frame 102 generally defines a single interior space (or compartment) for shielding the one or more electrical components 101 on the PCB 103. In still other exemplary embodiments, shielding apparatus may include frames with one or more interior dividers attached to sidewalls of the frame for sectioning the frame into two or more interior spaces.

The illustrated frame 102 may be configured for handling by pick-and-place equipment (e.g., vacuum pick-and-place equipment, etc.). To this end, the central hub 148 may be configured (e.g., sized, shaped, etc.) for use as a frame pick-up area that may be gripped or to which suction may be applied by the pick-and-place equipment for handling during, for example, fabrication of the frame 102 and/or installation of the frame 102 to the PCB 103. In other exemplary embodiments, the frame 102 may include, for example, tabs at the corners and/or along the sidewalls 126 as pick-up areas in addition to or in place of the central hub 148.

The sidewalls 126 of the frame 102 are configured to generally surround electrical components 101 on the PCB 103 when the frame 102 is attached to the PCB 103. As shown, each sidewall 126 is substantially planar in shape. Adjacent sidewalls 126 are oriented generally at right angles to each other, and opposing sidewalls 126 are generally parallel, thereby producing the generally rectangular shape of the illustrated frame 102.

The frame 102 may be formed from a single piece of electrically-conductive material so that the drawn latching features 110, sidewalls 126, top surface 136, braces 144 and pickup surface or hub 148 have an integral, monolithic construction. A wide range of electrically-conductive materials may be used to form the frame 102. By way of example, the frame 102 may be formed from cold rolled steel, nickel-silver alloys, copper-nickel alloys, stainless steel, tin-plated cold rolled steel, tin-plated copper alloys, carbon steel, brass, copper, aluminum, copper-beryllium alloys, phosphor bronze, steel, alloys thereof, or any other suitable electrically-conductive and/or magnetic materials. In addition, the frame 102 may be formed from a plastic material coated with electrically-conductive material. In one exemplary embodiment, a shielding apparatus includes a frame formed from a sheet of cold rolled steel having a thickness of about 0.20 millimeters. As another example, a shielding apparatus may include a frame configured from a suitable material having a thickness in the range of about 0.10 millimeters and about 0.30 millimeters. The materials and dimensions provided herein are for purposes of illustration only, as a frame may be configured from different materials and/or with different dimensions depending, for example, on the particular application, such as the electrical components to be shielded, space considerations within the overall electronic device, EMI shielding and heat dissipation needs, and other factors.

With reference to FIGS. 1-4, the cover 104 of the shielding apparatus 100 is shown with a generally rectangular shape corresponding to the shape of the frame 102. The cover 104 is configured to fit generally over the frame 102 for covering the opening 152 defined by the sidewalls 126 of the frame 102. At which point, the frame 102 and cover 104 may provide shielding to the one or more electrical components 101 on the PCB 103 disposed within the area cooperatively defined by the frame 102, the cover 104, and the PCB 103. In other exemplary embodiments, shielding apparatus may include covers having shapes different from that shown in the figures herein, but generally corresponding to shapes of frames of the shielding apparatus. For example, covers may have square configurations, triangular configurations, hexagonal configurations, other polygonal-shaped configurations, circular configurations, non-rectangular configurations, etc. Furthermore, covers may include shapes different from shapes of frames within the scope of the present disclosure.

The cover 104 includes a planar, flat top or upper surface 156 and multiple spaced apart retention and contact members 116, 158 extending generally downwardly from the top surface 156. In this example, the cover 104 includes two contact members 158 between each pair of retention members 116 along each side of the cover 104. The retention and contact members 116 and 158 are formed integrally (or monolithically) with the top surface 156 of the cover 104. The upper surface 156, the contact members 158, and the retention members 116 may be formed by one or more of bending, stamping, folding, etc. at least part of the cover 104 to a desired shape. In other exemplary embodiments, shielding apparatus may include covers having only retention members without any contact members. In still other exemplary embodiments, shielding apparatus may include covers having more or less retention members and contact members than illustrated in the figures.

Figure 5:
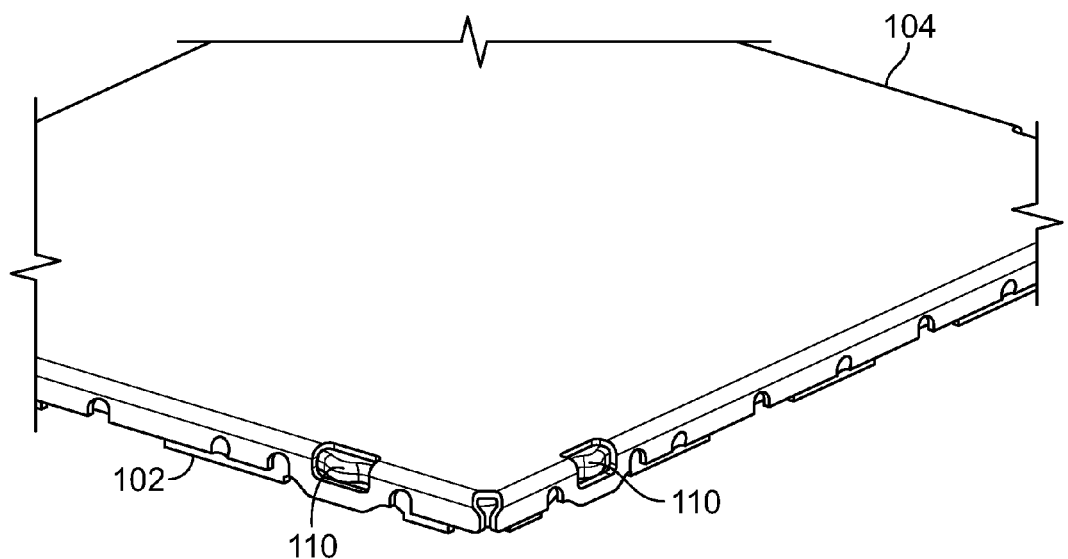
FIG. 5 is an enlarged perspective view of part of the frame and cover shown in FIG. 4, and illustrating the exemplary manner by which the cover is removably attached or latched to the frame via the engagement of the frame's drawn latching features within openings of the cover.

In this exemplary embodiment, the cover 104 also includes inwardly extending portions (e.g., half-dimples, dimples, bump, protrusion, etc.) for contacting the frame 102 to help reduce or inhibit rattling of the cover 104 when installed, e.g., latched, onto the frame 102. As shown in FIGS. 4 and 5, the cover 104 includes a half-dimple 162 on each contact member 158. The half-dimples 162 contact corresponding portions of the frame's sidewalls 126. This contact between the half-dimples 162 and the frame's sidewalls 126 helps to reduce or inhibit rattling of the cover 104 when installed to the frame 102, which may otherwise be caused due to an imperfect fit, mismatched sizing, manufacturing tolerances, etc. In other exemplary embodiments, a shielding apparatus may include a cover that does not have any half-dimples. For example, FIG. 8 illustrates an exemplary embodiment of a shielding apparatus 200 that includes a frame 202 having drawn latching features and a cover 204, where the cover does not include any half-dimples.

The upper or top surface 156 of the cover 104 may also include or be operable as a generally central pick-up surface configured for use in handling the cover 104 with pick-and-place equipment (e.g., vacuum pick-and-place equipment, etc.). The pick-up surface may be configured for use as a pick-up area that may be gripped or to which suction may be applied by the pick-and-place equipment for handling during, for example, fabrication of the cover 104 and/or installation of the cover 104 to the PCB 103. A central location of the pick-up surface may allow for balanced manipulation of the cover 104 during handling of the cover 104. In other exemplary embodiments, shielding apparatus may include covers with, for example, tabs at corners and/or alongside edges for use as pick-up surfaces in addition to or in place of centrally located pick-up surfaces.

In some exemplary embodiments, the top or upper surface 156 of the cover 104 may include apertures or holes, which may facilitate solder reflow heating interiorly of the cover 104, may enable cooling of the electrical components 101 within the shielding apparatus 100, and/or may permit visual inspection of members of the electrical components 101 beneath the cover 104. In some exemplary embodiments of a shielding apparatus, a cover may include holes that are sufficiently small to inhibit passage of interfering EMI. The particular number, size, shape, orientation, etc. of the holes may vary depending, for example, on the particular application (e.g., sensitivity of the electronics where more sensitive circuitry may necessitate the use of smaller diameter holes, etc.). For example, some exemplary embodiments of shielding apparatus (e.g., shielding apparatus 100, 200, etc.) may include covers without any such holes.

The illustrated shielding apparatus 100 includes a generally low profile (e.g., an ultra-low height) when the cover 104 is attached to the frame 102. For example, FIG. 7 shows an exemplary embodiment of the shielding apparatus 100 configured to have an overall height dimension of less than one millimeter when the cover 104 attached to the frame 102 may be less than one millimeter. In an exemplary embodiment, the shielding apparatus may have an overall height dimension of about 0.6 millimeters, 0.75 millimeters or 0.85 millimeters when the frame and cover are attached. In other exemplary embodiments, a shielding apparatus may have overall height dimensions of greater than or less than about one millimeter. For example, another exemplary embodiment of a shielding apparatus may include an overall height dimension of about 1.25 millimeters. In addition, the height of the drawn latching features on the frame may be between about 0.15 millimeters and 0.25 millimeters as measures from the outside surface of the frame wall to the outermost part of the drawn latching features. The dimensions of the drawn latching features may depend on the cover material thickness (e.g., 0.10 mm, 0.15 mm, etc.) and customer designated clearance between the frame and cover.

The cover 104 may be formed from a wide range of materials, which are preferably electrically-conductive materials. For example, the cover 104 may be formed from cold rolled steel, nickel-silver alloys, copper-nickel alloys, stainless steel, tin-plated cold rolled steel, tin-plated copper alloys, carbon steel, brass, copper, aluminum, copper-beryllium alloys, phosphor bronze, steel, alloys thereof, or any other suitable electrically-conductive and/or magnetic materials. The cover 104 may also be formed from a plastic material coated with electrically-conductive material. In one exemplary embodiment, a shielding apparatus includes a cover formed from a sheet of cold rolled steel having a thickness of about 0.15 millimeters. As another example, a shielding apparatus may include a cover configured from a suitable material having a thickness in the range of about 0.05 millimeters and about 0.30 millimeters. The materials and dimensions provided herein are for purposes of illustration only, as a cover may be configured from different materials and/or with different dimensions depending, for example, on the particular application, such as the electrical components to be shielded, space considerations within the overall electronic device, EMI shielding and heat dissipation needs, and other factors.

Accordingly, exemplary embodiments are disclosed herein of multi-piece shielding assemblies including a frame (or fence) having a top surface and sidewalls. The frame is partially drawn in construction so as to include one or more drawn latching features in or extending outwardly relative to the frame's top surface. The frame's drawn latching features are configured to be engaged within openings of the cover such that the cover may be removably attached to (e.g., releasably latched or snapped onto, etc.) the frame.

Drawing (or metal forming) the frame allows latching features or latches to be added to a top surface of the frame and controlled with the "sheet metal flat blank" for the frame. By drawing the latching features into the top of the frame, exemplary embodiments disclosed herein may provide or be associated with one or more (but not necessarily any or all) of the following advantages or improvements to the industry standard of adding lid attachment features to the sidewalls of the lid. For example, drawing the latching features into the top of the frame may allow for much lower assembly heights, provide a much more rigid structure allowing for better co-planarity and tighter tolerances, and allow for the use of a two-piece shield in areas that previously could only use single-piece EMI shielding soldered metal cans. With an ultra-low height design, exemplary embodiments of shielding assemblies disclosed herein may advantageously be used in smaller and thinner consumer electronic devices than some existing EMI shielding assemblies.

Exemplary embodiments of shielding assemblies having drawn latching features in the frame may advantageously provide improved structural rigidity for resisting deformation, which may provide a benefit prior to installation of a shielding apparatus to a PCB. During installation, flatness requirements can be especially important for ensuring proper contact to the solder paste thickness on the PCB prior to the soldering process.

In exemplary embodiments, the multi-piece shielding assembly is an ultra-low height two-piece board level shielding assembly where the frame (or fence) has a height of less than one millimeter (mm). For example, the height is less than 1 mm as measured from the uppermost surface of the frame to the surface (e.g., printed circuit board, etc.) to which the frame is soldered. The latching features may be drawn in the frame such that the top surface of the frame is coincident, aligned and/or co-planar with the top surfaces of the latching features. The top surfaces of the latching features are preferably no higher than (e.g., the same height, level with, lower than, etc.) the top surface of the frame, such that the latching features do not require any increased height or space to accommodate for the latching features.

In exemplary embodiments, the frame is drawn with latching features in the frame's top surface, whereby the drawn latching features allow the lid to snap onto the frame, e.g., in the areas without solder (e.g., areas adjacent and spaced apart from the solder areas at which the frame is soldered to the board, etc.). Only predetermined portions of the frame are drawn to form spaced-apart latching features along or adjacent the top surface of the frame which correspond to locations of openings in sidewalls of the cover. At those locations where the material of the frame is drawn to form the latching features, the frame includes openings or gaps where the material that was drawn is no longer present. The frame material is not drawn where latching features are not present. The latching features may be formed by drawing only portions of the frame without drawing an entire upper surface or perimeter lip of the frame, e.g., the frame includes the drawn latching features without having a draw lip about the entire upper perimeter of the frame. The drawn latching features may be formed solely by drawing, e.g., upwardly, the material from which the frame is made, e.g., without having to cut or otherwise remove material from the frame to form cutouts in the frame. The drawn latching features may be formed simultaneously in a single drawing process without cutting, which may thus allow for a reduced number of manufacturing steps and reduced material costs, e.g., by a reduction in the amount of scrap material.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally," "about," and "substantially," may be used herein to mean within manufacturing tolerances. Or for example, the term "about" as used herein when modifying a quantity of an ingredient or reactant of the invention or employed refers to variation in the numerical quantity that can happen through typical measuring and handling procedures used, for example, when making concentrates or solutions in the real world through inadvertent error in these procedures; through differences in the manufacture, source, or purity of the ingredients employed to make the compositions or carry out the methods; and the like. The term "about" also encompasses amounts that differ due to different equilibrium conditions for a composition resulting from a particular initial mixture. Whether or not modified by the term "about," the claims include equivalents to the quantities.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A shielding apparatus suitable for use in providing electromagnetic interference shielding for one or more electrical components on a substrate, the shielding apparatus comprising:
   a cover including one or more retention members having one or more cam surfaces and one or more openings;
   a frame having a top surface and sidewalls, the frame being partly drawn in construction such that the frame includes:
      one or more drawn latching features extending outwardly from the top surface of the frame, the one or more drawn latching features engageable within the one or more openings of the cover to thereby releasably attach the cover to the frame; and
      one or more openings along the sidewalls where material was drawn to form the one or more drawn latching features, which openings extend downwardly along the sidewalls from the one or more drawn latching features to a bottom of the frame such that each of the one or more openings along the sidewalls has an open shape;
   wherein the one or more drawn latching features contact and slide along the one or more cam surfaces of the one or more retention members of the cover when the cover is positioned over the frame, and wherein sliding contact of the one or more drawn latching features with the one or more cam surfaces causes the one or more retention members to move and allow the one or more drawn latching features to move into the one or more openings of the one or more retention members.

2. The shielding apparatus of claim 1, wherein the top surface of the frame includes surface portions that extend as one continuous piece along each of the sidewalls around an entire perimeter lip of the frame.

3. The shielding apparatus of claim 1, wherein the one or more openings along the sidewalls of the frame are each located in the sidewalls generally under a corresponding one of the drawn latching features where the material of a predetermined portion of the frame was drawn upwardly to form the corresponding one of the drawn latching features, whereby an absence of the drawn material defines the open shape of each of the one or more openings along the sidewalls whereat the drawn material is no longer present such that the open shape includes a closed end adjacent the corresponding one of the drawn latching features and an open end along the bottom of the frame.

4. The shielding apparatus of claim 1, wherein the one or more drawn latching features include a top surface that is coincident, aligned, and/or co-planar with the top surface of the frame, and wherein:
   each of the sidewalls of the frame includes one or more pairs of adjacent lower edge portions that define the bottom of the frame and provide areas for soldering the frame to a printed circuit board; and
   each of the one or more openings along the sidewalls of the frame is between a corresponding one of the pairs of adjacent lower edge portions of the frame, such that the adjacent lower edge portions are spaced apart from each other by a corresponding one of the one or more openings along the sidewalls.

5. The shielding apparatus of claim 1, wherein the one or more drawn latching features include a top surface that does not extend above the top surface of the frame such that the one or more drawn latching features do not increase an overall height of the frame, and wherein each of the one or more openings along the sidewalls includes a closed end adjacent the corresponding one of the drawn latching features and an open end along the bottom of the frame.

6. The shielding apparatus of claim 1, wherein:
   each of the sidewalls of the frame includes lower edge portions that are spaced apart, that define the bottom of the frame, and that provide areas for soldering the frame to a printed circuit board;
   at least one opening of the one or more openings along the sidewalls of the frame is between at least one adjacent pair of the lower edge portions of the frame such that the at least one adjacent pair of the lower edge portions are spaced apart by the at least one opening therebetween, the at least one opening extending from below a corresponding one of the one or more drawn latching features downwardly to the at least one adjacent pair of the lower edge portions such that the open shape of the at least one opening is defined between the at least one adjacent pair of the lower edge portions, whereby the at least one opening may allow solder to flow around the at least one adjacent pair of the lower edge portions when soldering the frame to a printed circuit board; and
   the one or more drawn latching features are spaced apart from and not aligned with or over the lower edge portions of the frame, whereby the cover is attachable to the frame in areas without solder.

7. The shielding apparatus of claim 1, wherein the one or more drawn latching features comprise at least one drawn portion along each side of the frame that protrudes outwardly relative to a corresponding one of the sidewalls, and wherein:
   each of the sidewalls of the frame includes lower edge portions that are spaced apart, that define the bottom of the frame, and that provide areas for soldering the frame to a printed circuit board;
   each of the one or more openings along the sidewalls of the frame is between an adjacent pair of the lower edge portions of the frame that are spaced apart from each other by a corresponding one of the one or more openings along the sidewalls; and
   the one or more drawn latching features are spaced apart from and not aligned with or over the lower edge portions of the frame.

8. The shielding apparatus of claim 1, wherein:
   the one or more drawn latching features comprise two or more drawn portions along each side of the frame that protrude outwardly relative to a corresponding one of the sidewalls;
   the frame includes a corner between each pair of sidewalls that is also disposed between a corresponding pair of the two or more drawn portions;
   each of the sidewalls of the frame includes lower edge portions that define the bottom of the frame and provide areas for soldering the frame to a printed circuit board; and
   each of the one or more openings along the sidewalls of the frame is between an adjacent pair of the lower edge portions of the frame that are spaced apart from each other by a corresponding one of the one or more openings along the sidewalls; and
   the one or more drawn latching features are spaced apart from and not aligned with or over the lower edge portions of the frame, whereby the cover is attachable to the frame in areas without solder.

9. The shielding apparatus of claim 1, wherein:
   the top surface of the frame includes flanges that extend as one continuous piece along each of the sidewalls around a perimeter of the frame, and cross braces extending from each of the flanges to a central hub for providing stiffening support to the frame to resist deformation and/or to help maintain the sidewalls in an original shape of the frame; and the top surface, the sidewalls, and the one or more drawn latching features are integrally formed from a single piece of electrically-conductive material such that the frame has a monolithic construction.

10. The shielding apparatus of claim 1, wherein the cover includes:
a top surface substantially covering at least one opening defined by the frame when the cover is releasably attached to the frame;
wherein the one or more retention members depend downwardly relative to the top surface; and
wherein the top surface of the frame includes surface portions that extend as one continuous piece along each of the sidewalls around an entire perimeter lip of the frame and one or more cross braces extending from each of the sidewalls to a central hub.

11. The shielding apparatus of claim 1, wherein:
the one or more openings along the sidewalls of the frame are located in the sidewalls generally under a corresponding one of the drawn latching features;
the one or more drawn latching features include a top surface that does not extend above the top surface of the frame such that the one or more drawn latching features do not increase an overall height of the frame;
each of the sidewalls of the frame includes lower edge portions that are spaced apart, that define the bottom of the frame, and that provide areas for soldering the frame to a printed circuit board,
the one or more drawn latching features are spaced apart from and not aligned with or over the lower edge portions of the frame, whereby the cover is attachable to the frame in areas without solder;
the one or more drawn latching features comprise at least one drawn portion along each side of the frame that protrudes outwardly relative to a corresponding one of the sidewalls; and
the top surface, the sidewalls, and the one or more drawn latching features are integrally formed from a single piece of electrically-conductive material such that the frame has a monolithic construction.

12. The shielding apparatus of claim 11, wherein:
the one or more drawn latching features comprise two or more drawn portions along each side of the frame that protrude outwardly relative to a corresponding one of the sidewalls;
the frame includes a corner between each pair of sidewalls that is also disposed between a corresponding pair of the two or more drawn portions; and
the cover includes:
a top surface substantially covering at least one opening defined by the frame when the cover is releasably attached to the frame,
the one or more retention members depending downwardly relative to the top surface; and
one or more contact members depending downwardly relative to the top surface, the one or more contact members including inwardly extending portions for contacting the sidewalls of the frame to help inhibit rattling of the cover when attached to the frame;
whereby the shielding apparatus is operable for shielding the one or more electrical components on the substrate that are within an interior cooperatively defined by the frame, the cover, and the substrate.

13. The shielding apparatus of claim 1, wherein:
the top surface of the frame includes surface portions that extend as one continuous piece along each of the sidewalls around an entire perimeter lip of the frame; and
the frame and the cover allow for repeatedly engagement and disengagement of the one or more drawn latching features and the one or more openings of the cover, thereby allowing repeated removal and reattachment of the cover to/from the frame.

14. The shielding apparatus of claim 1, wherein:
the top surface of the frame includes surface portions that extend as one continuous piece along each of the sidewalls around an entire perimeter lip of the frame;
the one or more drawn latching features comprise at least one drawn portion along each side of the frame that protrudes outwardly relative to a corresponding one of the sidewalls;
the one or more drawn latching features are the only portion of the frame that is drawn;
the one or more drawn latching features are formed solely by the drawn material without cutting the drawn material such that the one or more drawn latching features do not include cutouts; and
the one or more openings along the sidewalls extend from a corresponding one of the drawn latching features to a bottom of the frame.

15. A shielding apparatus suitable for use in providing electromagnetic interference shielding for one or more electrical components on a substrate, the shielding apparatus comprising:
a cover including an upper surface and retention members extending generally downwardly from the upper surface, the retention members including cam surfaces and openings therein; and
a frame having a top surface and sidewalls, the frame being partly drawn in construction such that the top surface includes spaced-apart drawn portions protruding outwardly from the sidewalls that contact and slide along the cam surfaces of the cover's retention members when the cover is positioned over the frame to thereby engage within the openings of the cover's retention members for removably attaching the cover to the frame, wherein the frame includes openings along the sidewalls where material was drawn to form the spaced-apart drawn portions which openings extend downwardly along the sidewalls from the spaced-apart drawn portions to a bottom of the frame such that each of the openings along the sidewalls has an open shape.

16. The shielding apparatus of claim 15, wherein:
the top surface of the frame includes flanges that extend as one continuous piece along each of the sidewalls around an entire perimeter of the frame; and
the top surface of the frame includes a central hub and one or more cross braces extending from each of the sidewalls to the central hub for providing stiffening support to the frame to resist deformation and/or to help maintain the sidewalls in an original shape of the frame.

17. The shielding apparatus of claim 15, wherein the one or more openings along the sidewalls are under the spaced-apart drawn portions where only predetermined portions of the material was drawn upwardly from the sidewalls at locations corresponding to locations of the openings in the cover to form the spaced-apart drawn portions without having to cut or otherwise remove material from the frame, whereby an absence of the drawn material defines the open shape of each of the one or more openings along the sidewalls whereat the drawn material is no longer present such that the open shape includes a closed end adjacent the corresponding one of the spaced-apart drawn portions and an open end along the bottom of the frame.

18. The shielding apparatus of claim 15, wherein:
the top surface of the frame includes surface portions that extend as one continuous piece along each of the sidewalls around an entire perimeter lip of the frame;
the drawn portions include a top surface that does not extend above the top surface of the frame such that the drawn portions do not increase an overall height of the frame;
each of the sidewalls of the frame includes lower edge portions that are spaced apart by the one or more openings along the sidewalls, that define the bottom of the frame, and that provide areas for soldering the frame to a printed circuit board;
the drawn portions are spaced apart from and not aligned with or over the lower edge portions of the frame, whereby the cover is attachable to the frame in areas without solder; and
the top surface, the sidewalls, and the drawn portions are integrally formed from a single piece of electrically-conductive material such that the frame has a monolithic construction.

19. A method for making a frame of an electromagnetic interference shielding apparatus having a top surface and sidewalls downwardly depending from the top surface, the method comprising drawing a piece of material over a die such that the top surface includes spaced-apart drawn portions protruding outwardly from the sidewalls for sliding engagement within openings of a cover for removably attaching the cover to the frame, whereby the spaced-apart drawn portions are formed solely by drawing only predetermined portions of the piece of material upwardly at locations corresponding to locations of the openings in the cover without cutting the drawn portions and without having to cut or otherwise remove material from the frame, whereby openings are formed along the sidewalls of the frame where material was drawn to form the spaced-apart drawn portions which openings extend downwardly along the sidewalls from the spaced-apart drawn portions to a bottom of the frame such that each of the openings along the sidewalls has an open shape and such that the sidewalls include lower edge portions that are spaced apart and that define the bottom of the frame.

20. The method of claim 19, wherein:
the top surface of the frame includes surface portions that extend as one continuous piece along each of the sidewalls around an entire perimeter lip of the frame; and
the spaced-apart drawn portions are formed simultaneously in a single drawing process; and
the spaced-apart drawn portions include a top surface that is coincident, aligned, and/or co-planar with the top surface of the frame or that does not extend above the top surface of the frame such that the one or more drawn latching features do not increase an overall height of the frame; and
the lower edge portions of the sidewalls are spaced apart by the openings along the sidewalls and provide areas for soldering the frame to a printed circuit board, the open shape of each of the openings along the sidewalls defined between a corresponding adjacent pair of the lower edge portions such that the open shape includes a closed end adjacent the corresponding one of the spaced-apart drawn portions and an open end along the bottom of the frame, and the spaced-apart drawn portions are spaced apart from and not aligned with or over the lower edge portions of the frame, whereby the cover is attachable to the frame in areas without solder.

* * * * *